(12) United States Patent
Bagschik et al.

(10) Patent No.: US 11,810,225 B2
(45) Date of Patent: Nov. 7, 2023

(54) TOP-DOWN SCENE GENERATION

(71) Applicant: Zoox, Inc., Foster City, CA (US)

(72) Inventors: Gerrit Bagschik, Foster City, CA (US); Andrew Scott Crego, Foster City, CA (US); Gowtham Garimella, Burlingame, CA (US); Michael Haggblade, El Dorado Hills, CA (US); Andraz Kavalar, San Francisco, CA (US); Kai Zhenyu Wang, Foster City, CA (US)

(73) Assignee: Zoox, Inc., Foster City, CA (US)

( * ) Notice: Subject to any disclaimer, the term of this patent is extended or adjusted under 35 U.S.C. 154(b) by 0 days.

(21) Appl. No.: 17/218,010

(22) Filed: Mar. 30, 2021

(65) Prior Publication Data

US 2022/0319057 A1 Oct. 6, 2022

(51) Int. Cl.
| | |
|---|---|
| *G06T 11/00* | (2006.01) |
| *G06N 3/088* | (2023.01) |
| *G06F 30/27* | (2020.01) |
| *G06N 3/045* | (2023.01) |

(52) U.S. Cl.
CPC .............. *G06T 11/00* (2013.01); *G06F 30/27* (2020.01); *G06N 3/045* (2023.01); *G06N 3/088* (2013.01)

(58) Field of Classification Search
CPC ....... G06T 11/00; G06F 30/27; G06N 3/0454; G06N 3/088
See application file for complete search history.

(56) References Cited

U.S. PATENT DOCUMENTS

| | | | | |
|---|---|---|---|---|
| 9,720,415 | B2* | 8/2017 | Levinson | G05D 1/0257 |
| 10,248,664 | B1* | 4/2019 | Shen | G06V 20/10 |
| 10,437,252 | B1* | 10/2019 | Liu | G01C 21/32 |
| 10,495,753 | B2* | 12/2019 | Melvin | G06F 18/22 |
| 10,625,748 | B1* | 4/2020 | Dong | B60W 30/0956 |
| 10,739,775 | B2* | 8/2020 | Sun | G05D 1/0088 |
| 10,794,710 | B1* | 10/2020 | Liu | G06T 7/73 |
| 10,816,993 | B1* | 10/2020 | Tran | G06V 20/56 |
| 10,928,830 | B1* | 2/2021 | Tran | G06N 3/045 |
| 10,942,030 | B2* | 3/2021 | Haque | G05D 1/0088 |
| 10,981,564 | B2* | 4/2021 | Herman | B60W 30/09 |

(Continued)

FOREIGN PATENT DOCUMENTS

EP 3640857 4/2020

OTHER PUBLICATIONS

The International Search Report and Written Opinion for PCT Application No. PCT/US22/20597, dated Jun. 16, 2022, 10 pages.

(Continued)

*Primary Examiner* — Charles L Beard
(74) *Attorney, Agent, or Firm* — Lee & Hayes, P.C.

(57) ABSTRACT

Techniques for top-down scene generation are discussed. A generator component may receive multi-dimensional input data associated with an environment. The generator component may generate, based at least in part on the multi-dimensional input data, a generated top-down scene. A discriminator component receives the generated top-down scene and a real top-down scene. The discriminator component generates binary classification data indicating whether an individual scene in the scene data is classified as generated or classified as real. The binary classification data is provided as a loss to the generator component and the discriminator component.

20 Claims, 7 Drawing Sheets

(56) References Cited

U.S. PATENT DOCUMENTS

| | | | |
|---|---|---|---|
| 11,023,749 B2* | 6/2021 | Garimella | G06V 20/588 |
| 11,062,454 B1* | 7/2021 | Cohen | G06V 10/82 |
| 11,087,477 B2* | 8/2021 | Choi | G06N 3/045 |
| 11,092,966 B2* | 8/2021 | ReMine | G06V 10/7747 |
| 11,195,418 B1* | 12/2021 | Hong | G08G 1/166 |
| 11,243,532 B1* | 2/2022 | Levihn | G06N 3/045 |
| 11,315,358 B1* | 4/2022 | Lo | G06V 40/1388 |
| 11,354,913 B1* | 6/2022 | Houston | G06F 18/24 |
| 11,367,289 B1* | 6/2022 | Widjaja | G06V 20/70 |
| 11,380,108 B1* | 7/2022 | Cai | G06N 20/00 |
| 11,415,997 B1* | 8/2022 | Dolan | G06F 11/3688 |
| 11,427,195 B1* | 8/2022 | Pertsel | B60R 1/00 |
| 11,460,857 B1* | 10/2022 | Tan | G06N 20/00 |
| 11,520,342 B2* | 12/2022 | Jiao | G05D 1/0214 |
| 11,526,721 B1* | 12/2022 | O'Malley | G06F 30/15 |
| 11,527,084 B2* | 12/2022 | Taghavi | G06V 20/647 |
| 11,537,134 B1* | 12/2022 | Wiest | G06N 3/0455 |
| 11,565,709 B1* | 1/2023 | Caldwell | G06N 3/088 |
| 11,590,969 B1* | 2/2023 | Crego | G06N 3/09 |
| 11,645,518 B2* | 5/2023 | White | G06N 3/084 |
| | | | 434/66 |
| 11,648,901 B1* | 5/2023 | Muralidharan | B60R 21/215 |
| | | | 280/734 |
| 11,741,274 B1* | 8/2023 | Crego | G06N 7/01 |
| | | | 703/8 |
| 2006/0109793 A1* | 5/2006 | Kim | H04L 63/1433 |
| | | | 370/250 |
| 2018/0336423 A1 | 11/2018 | Ban et al. | |
| 2018/0336471 A1* | 11/2018 | Rezagholizadeh | G06N 3/047 |
| 2018/0349547 A1* | 12/2018 | Sun | G06F 30/20 |
| 2019/0026531 A1* | 1/2019 | Alvarez Gonzalez | |
| | | | G06V 10/443 |
| 2019/0049970 A1* | 2/2019 | Djuric | B60W 60/00276 |
| 2019/0049987 A1* | 2/2019 | Djuric | G06N 3/08 |
| 2019/0101924 A1* | 4/2019 | Styler | G05D 1/0088 |
| 2019/0130639 A1* | 5/2019 | Boyce | G06N 3/045 |
| 2019/0138850 A1* | 5/2019 | Sigal | G06N 3/084 |
| 2019/0149863 A1* | 5/2019 | Lewis | H04N 21/25891 |
| | | | 706/12 |
| 2019/0156485 A1* | 5/2019 | Pfeiffer | G05D 1/0253 |
| 2019/0176818 A1* | 6/2019 | Movert | G06N 3/045 |
| 2019/0212453 A1* | 7/2019 | Natroshvili | G06N 3/045 |
| 2019/0212749 A1* | 7/2019 | Chen | B60W 30/00 |
| 2019/0220011 A1* | 7/2019 | Della Penna | G05D 1/0212 |
| 2019/0232489 A1* | 8/2019 | Pascanu | G05B 13/027 |
| 2019/0243372 A1* | 8/2019 | Huval | B60W 30/0953 |
| 2019/0303759 A1* | 10/2019 | Farabet | G06F 9/455 |
| 2019/0332118 A1* | 10/2019 | Wang | G06N 20/00 |
| 2019/0354786 A1* | 11/2019 | Lee | G06N 3/084 |
| 2019/0369637 A1* | 12/2019 | Shalev-Shwartz | |
| | | | G01C 21/3415 |
| 2019/0382007 A1* | 12/2019 | Casas | G06N 3/045 |
| 2019/0385051 A1* | 12/2019 | Wabgaonkar | G06N 3/084 |
| 2020/0026278 A1* | 1/2020 | Khanna | G06N 3/045 |
| 2020/0033866 A1* | 1/2020 | Song | G06N 3/08 |
| 2020/0050854 A1* | 2/2020 | Cheng | G06F 17/18 |
| 2020/0065665 A1* | 2/2020 | Nageshrao | G06N 3/045 |
| 2020/0065711 A1* | 2/2020 | Clément | G06N 3/044 |
| 2020/0089247 A1* | 3/2020 | Shkurti | G06N 3/006 |
| 2020/0097742 A1* | 3/2020 | Ratnesh Kumar | G06V 10/764 |
| 2020/0110416 A1* | 4/2020 | Hong | G01C 21/3602 |
| 2020/0134494 A1* | 4/2020 | Venkatadri | G06N 3/047 |
| 2020/0151497 A1* | 5/2020 | Kojima | G06F 18/214 |
| 2020/0160598 A1* | 5/2020 | Manivasagam | G06N 3/045 |
| 2020/0189579 A1* | 6/2020 | Haque | B60W 30/095 |
| 2020/0207375 A1* | 7/2020 | Mehta | G06V 20/56 |
| 2020/0226430 A1* | 7/2020 | Ahuja | G06N 3/045 |
| 2020/0286256 A1* | 9/2020 | Houts | G06T 5/009 |
| 2020/0301799 A1* | 9/2020 | Manivasagam | G01S 17/89 |
| 2020/0334524 A1* | 10/2020 | Sprague | G06V 10/95 |
| 2020/0353943 A1* | 11/2020 | Siddiqui | G06N 3/045 |
| 2020/0363813 A1* | 11/2020 | He | G06N 3/006 |
| 2020/0363814 A1* | 11/2020 | He | G06N 3/045 |
| 2020/0364554 A1* | 11/2020 | Wang | G06T 7/11 |
| 2020/0380085 A1* | 12/2020 | Behrendt | G01S 7/417 |
| 2020/0406905 A1* | 12/2020 | Dong | B60W 60/00274 |
| 2020/0410062 A1* | 12/2020 | O'Malley | B60W 60/001 |
| 2020/0410063 A1* | 12/2020 | O'Malley | G06F 30/20 |
| 2020/0410288 A1* | 12/2020 | Capota | G06F 18/214 |
| 2021/0001884 A1 | 1/2021 | Alvarez et al. | |
| 2021/0001897 A1* | 1/2021 | Chai | G08G 1/0129 |
| 2021/0004012 A1* | 1/2021 | Marchetti-Bowick | |
| | | | G01C 21/3446 |
| 2021/0004611 A1* | 1/2021 | Garimella | G06T 11/60 |
| 2021/0009166 A1* | 1/2021 | Li | G06F 16/903 |
| 2021/0049456 A1* | 2/2021 | Kursun | G06F 18/217 |
| 2021/0056863 A1* | 2/2021 | Stefanescu | G06N 3/088 |
| 2021/0078603 A1* | 3/2021 | Nakhaei Sarvedani | |
| | | | B60W 30/18163 |
| 2021/0096571 A1* | 4/2021 | Modalavalasa | G06V 20/58 |
| 2021/0097148 A1* | 4/2021 | Bagschik | G06F 30/15 |
| 2021/0101619 A1* | 4/2021 | Weast | G06N 7/01 |
| 2021/0124355 A1 | 4/2021 | Kirigan et al. | |
| 2021/0133483 A1* | 5/2021 | Prabhu | G06V 10/28 |
| 2021/0146963 A1* | 5/2021 | Li | B60W 60/00274 |
| 2021/0150244 A1* | 5/2021 | Segal | G06V 20/56 |
| 2021/0152996 A1* | 5/2021 | Manivasagam | G08G 1/163 |
| 2021/0163038 A1* | 6/2021 | Huang | G06V 20/58 |
| 2021/0166340 A1* | 6/2021 | Nikola | G01C 21/3811 |
| 2021/0172752 A1* | 6/2021 | Zhang | G06F 16/29 |
| 2021/0174669 A1* | 6/2021 | Guan | G06N 3/08 |
| 2021/0181754 A1* | 6/2021 | Cui | B60W 60/0011 |
| 2021/0181758 A1* | 6/2021 | Das | G06T 7/215 |
| 2021/0191395 A1* | 6/2021 | Gao | G06F 18/213 |
| 2021/0192748 A1* | 6/2021 | Morales Morales | |
| | | | G05D 1/0088 |
| 2021/0223780 A1* | 7/2021 | Bramley | G06V 10/82 |
| 2021/0237761 A1* | 8/2021 | Das | G06T 7/20 |
| 2021/0264284 A1* | 8/2021 | Gupta | G06N 3/088 |
| 2021/0276587 A1* | 9/2021 | Urtasun | G06N 3/08 |
| 2021/0276595 A1* | 9/2021 | Casas | B60W 60/0027 |
| 2021/0278852 A1* | 9/2021 | Urtasun | G06V 10/82 |
| 2021/0279640 A1* | 9/2021 | Tu | G01S 17/931 |
| 2021/0279841 A1* | 9/2021 | Liu | G06T 11/001 |
| 2021/0286371 A1* | 9/2021 | Choi | G05D 1/0221 |
| 2021/0286923 A1* | 9/2021 | Kristensen | G01S 7/412 |
| 2021/0294944 A1* | 9/2021 | Nassar | G06F 30/27 |
| 2021/0295171 A1* | 9/2021 | Kamenev | G06N 3/045 |
| 2021/0302187 A1* | 9/2021 | Nagavalli | G01C 21/3407 |
| 2021/0303922 A1* | 9/2021 | Tu | G06V 20/64 |
| 2021/0304018 A1* | 9/2021 | Usman | G06F 11/3409 |
| 2021/0309248 A1* | 10/2021 | Choe | B60W 50/06 |
| 2021/0319090 A1* | 10/2021 | Demir | G06N 3/045 |
| 2021/0347377 A1* | 11/2021 | Siebert | G05D 1/0274 |
| 2021/0347381 A1* | 11/2021 | Zhu | B60W 10/18 |
| 2021/0347383 A1* | 11/2021 | Siebert | G01C 21/3407 |
| 2021/0358164 A1* | 11/2021 | Liu | G06V 10/764 |
| 2021/0370972 A1* | 12/2021 | Bagschik | B60W 50/045 |
| 2021/0374947 A1* | 12/2021 | Shin | G06V 10/776 |
| 2021/0403001 A1* | 12/2021 | Del Pero | G08G 1/04 |
| 2021/0403036 A1* | 12/2021 | Danna | G01C 21/3407 |
| 2021/0405642 A1* | 12/2021 | Danford | G06V 20/588 |
| 2021/0406559 A1* | 12/2021 | Efland | G06V 10/803 |
| 2021/0406560 A1* | 12/2021 | Park | G06V 20/58 |
| 2022/0012596 A1* | 1/2022 | Nie | G06T 11/60 |
| 2022/0032970 A1* | 2/2022 | Vadivelu | G06N 7/01 |
| 2022/0035375 A1* | 2/2022 | Rezaee | G05B 13/027 |
| 2022/0035376 A1* | 2/2022 | Laddah | G05D 1/0221 |
| 2022/0035874 A1* | 2/2022 | Shintani | G06F 16/9537 |
| 2022/0044024 A1* | 2/2022 | Sambo | G06T 17/00 |
| 2022/0048503 A1* | 2/2022 | Khandelwal | B60W 30/0953 |
| 2022/0048535 A1* | 2/2022 | Niendorf | B60W 60/0011 |
| 2022/0055641 A1* | 2/2022 | Wolff | G06N 20/00 |
| 2022/0055663 A1* | 2/2022 | Buehler | G06V 20/584 |
| 2022/0063667 A1* | 3/2022 | Wolff | B60W 40/10 |
| 2022/0066459 A1* | 3/2022 | Jain | G06N 3/045 |
| 2022/0067877 A1* | 3/2022 | Nikola | G06N 3/088 |
| 2022/0083807 A1* | 3/2022 | Zhang | G06T 11/60 |
| 2022/0086403 A1* | 3/2022 | Levi | G06N 3/02 |
| 2022/0092349 A1* | 3/2022 | Yang | G06V 20/56 |
| 2022/0101042 A1* | 3/2022 | Kaminitz | G06F 18/231 |
| 2022/0101155 A1* | 3/2022 | Beaudoin | G06N 3/08 |
| 2022/0103839 A1* | 3/2022 | Van Rozendaal | G06N 3/045 |

(56) References Cited

U.S. PATENT DOCUMENTS

| | | |
|---|---|---|
| 2022/0108213 A1* | 4/2022 | Cao .................. G06N 3/084 |
| 2022/0114764 A1* | 4/2022 | Beijbom .............. G06V 10/764 |
| 2022/0122001 A1* | 4/2022 | Choe .................. G06N 20/20 |
| 2022/0126878 A1* | 4/2022 | Moustafa ............. G06T 1/0007 |
| 2022/0129362 A1* | 4/2022 | Beijbom ............... G06F 11/27 |
| 2022/0137636 A1* | 5/2022 | Yang .................. G01S 17/894 |
| | | 701/28 |
| 2022/0138568 A1* | 5/2022 | Smolyanskiy ......... G06N 3/044 |
| | | 706/21 |
| 2022/0144260 A1* | 5/2022 | Chen .................. G06V 20/20 |
| 2022/0147743 A1* | 5/2022 | Roy .................. G06V 10/82 |
| 2022/0153298 A1* | 5/2022 | Wang .................. G06N 20/00 |
| 2022/0153309 A1* | 5/2022 | Cui .................. G05B 13/027 |
| 2022/0153314 A1* | 5/2022 | Suo ................ B60W 60/00276 |
| 2022/0153315 A1* | 5/2022 | Zeng ................ B60W 40/072 |
| 2022/0155451 A1* | 5/2022 | Bacchus .............. G01S 17/931 |
| 2022/0156525 A1* | 5/2022 | Guizilini ............ G06F 18/2148 |
| 2022/0156939 A1* | 5/2022 | Homayounfar ...... G06V 10/945 |
| 2022/0157161 A1* | 5/2022 | Tan .................. G06F 18/2415 |
| 2022/0164942 A1* | 5/2022 | Dev .................. G06N 3/08 |
| 2022/0172452 A1* | 6/2022 | Wang .................. G06V 10/806 |
| 2022/0180106 A1* | 6/2022 | Voodarla .............. G06V 10/25 |
| 2022/0180476 A1* | 6/2022 | Poddar ................ G06N 3/045 |
| 2022/0185323 A1* | 6/2022 | Dolben .............. B60W 60/0011 |
| 2022/0188692 A1* | 6/2022 | Chakraborty .......... G06N 20/00 |
| 2022/0189049 A1* | 6/2022 | Watson ................ G06T 3/0093 |
| 2022/0189060 A1* | 6/2022 | Türkoglu ............. G06T 7/11 |
| 2022/0189145 A1* | 6/2022 | Evans ................ G06V 10/776 |
| 2022/0204020 A1* | 6/2022 | Misu ................ B60W 60/001 |
| 2022/0207275 A1* | 6/2022 | Parikh ................ G06V 10/809 |
| 2022/0215232 A1* | 7/2022 | Pardeshi ............. G06T 7/246 |
| 2022/0215266 A1* | 7/2022 | Venkataraman ........ G06T 17/20 |
| 2022/0230026 A1* | 7/2022 | Valois ............... B60W 60/0025 |
| 2022/0245441 A1* | 8/2022 | Dechene ............. H04L 41/145 |
| 2022/0247643 A1* | 8/2022 | Dechene ............. H04L 41/145 |
| 2022/0253720 A1* | 8/2022 | Chehade ............. G06N 20/00 |
| 2022/0274625 A1* | 9/2022 | Garimella ............ G06N 3/04 |
| 2022/0283055 A1* | 9/2022 | Ashayer .............. G06F 30/15 |
| 2022/0284470 A1* | 9/2022 | Gee .................. G06N 3/084 |
| 2022/0292091 A1* | 9/2022 | Capota ............... G06F 16/2458 |
| 2022/0301301 A1* | 9/2022 | Marciano, Jr. ........ G06F 18/217 |
| 2022/0314993 A1* | 10/2022 | Bagschik ............ B60W 60/001 |
| 2022/0319336 A1* | 10/2022 | Averbuch ............ G08G 1/0141 |
| 2022/0326023 A1* | 10/2022 | Xu .................. G01C 21/3807 |
| 2022/0335689 A1* | 10/2022 | Zhu .................. G06N 3/048 |
| 2022/0363247 A1* | 11/2022 | Hendy ................ B60W 10/20 |
| 2022/0371613 A1* | 11/2022 | Caldwell ............. B60W 30/12 |
| 2022/0373354 A1* | 11/2022 | Ferroni .............. G01C 21/3407 |
| 2022/0385907 A1* | 12/2022 | Zhang ................ H04N 19/172 |
| 2022/0388532 A1* | 12/2022 | Yangel ............... G06V 20/56 |
| 2022/0391766 A1* | 12/2022 | Acuna Marrero ..... G06N 20/00 |
| 2022/0396281 A1* | 12/2022 | Brännström ......... G06V 10/809 |
| 2022/0398758 A1* | 12/2022 | Guo .................. G06N 3/0464 |
| 2023/0022966 A1* | 1/2023 | Parisi ................ G06F 16/65 |
| 2023/0052339 A1* | 2/2023 | Saxena ............... G06N 3/0475 |
| 2023/0078218 A1* | 3/2023 | Wang ................. G06N 3/098 |
| | | 706/12 |
| 2023/0107372 A1* | 4/2023 | Shibata .............. G06T 7/277 |
| | | 382/103 |
| 2023/0121534 A1* | 4/2023 | Rukhovich ........... G06V 10/40 |
| | | 382/103 |
| 2023/0150529 A1* | 5/2023 | Stenson .............. G06N 3/08 |
| | | 701/23 |
| 2023/0150549 A1* | 5/2023 | Morales Morales ....... |
| | | B60W 60/0017 |
| | | 701/23 |
| 2023/0159059 A1* | 5/2023 | Garimella ......... B60W 60/0027 |
| | | 701/26 |
| 2023/0159060 A1* | 5/2023 | Garimella .......... B60W 60/001 |
| | | 701/26 |
| 2023/0162470 A1* | 5/2023 | Garimella ............ G06V 20/56 |
| | | 382/103 |
| 2023/0186098 A1* | 6/2023 | Chang ............... G06N 3/045 |
| | | 706/25 |
| 2023/0186646 A1* | 6/2023 | Ghalyan .............. G06V 20/17 |
| | | 382/103 |
| 2023/0192127 A1* | 6/2023 | Funke ............... B60W 60/0011 |
| | | 701/25 |
| 2023/0192145 A1* | 6/2023 | Das ................. G06V 10/40 |
| | | 701/26 |
| 2023/0196759 A1* | 6/2023 | Hong ................ G06V 10/7747 |
| | | 382/157 |
| 2023/0206604 A1* | 6/2023 | Poddar ................ G06V 10/48 |
| | | 382/100 |
| 2023/0229832 A1* | 7/2023 | Matti ................ G06F 30/20 |
| | | 703/8 |
| 2023/0237819 A1* | 7/2023 | Ghazvinian Zanjani .... |
| | | G06V 20/70 |
| | | 382/156 |
| 2023/0251199 A1* | 8/2023 | Lorsakul ............ G01N 21/6456 |
| | | 382/133 |
| 2023/0252687 A1* | 8/2023 | Zhang ................ G06N 3/08 |
| | | 382/159 |
| 2023/0276063 A1* | 8/2023 | Kim .................. G06N 3/08 |
| | | 375/240.08 |

OTHER PUBLICATIONS

Huang, et al., "An Improved Discriminator for GAN-Based Trajectory Prediction Models", 2020, 3 pgs.
Liu, et al. "A Nighttime Vehicle Detection Method with Attentive GAN for Accurate Classification and Regression", 2021, 17 pgs.
Office Action for U.S. Appl. No. 17/218,051, dated Mar. 31, 2023, Bagschik, "Top-Down Scene Discrimination", 16 pages.
Zheng, et al., "Using Vehicle Synthesis Generative Adversarial Networks to Improve Vehicle Detection in Remote Sensing Images", 2019, 14 pgs.

* cited by examiner

TOP-DOWN SCENE GENERATION

BACKGROUND

An autonomous driving system may be trained by operating or simulating the autonomous driving system in multiple driving situations and environments. The accuracy and performance of the autonomous driving system can be analyzed in each driving situation and may be modified, as needed, based on the analysis. To fully test an autonomous driving system, it may be desirable to operate or simulate the autonomous driving system in a large number of different situations and environments.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
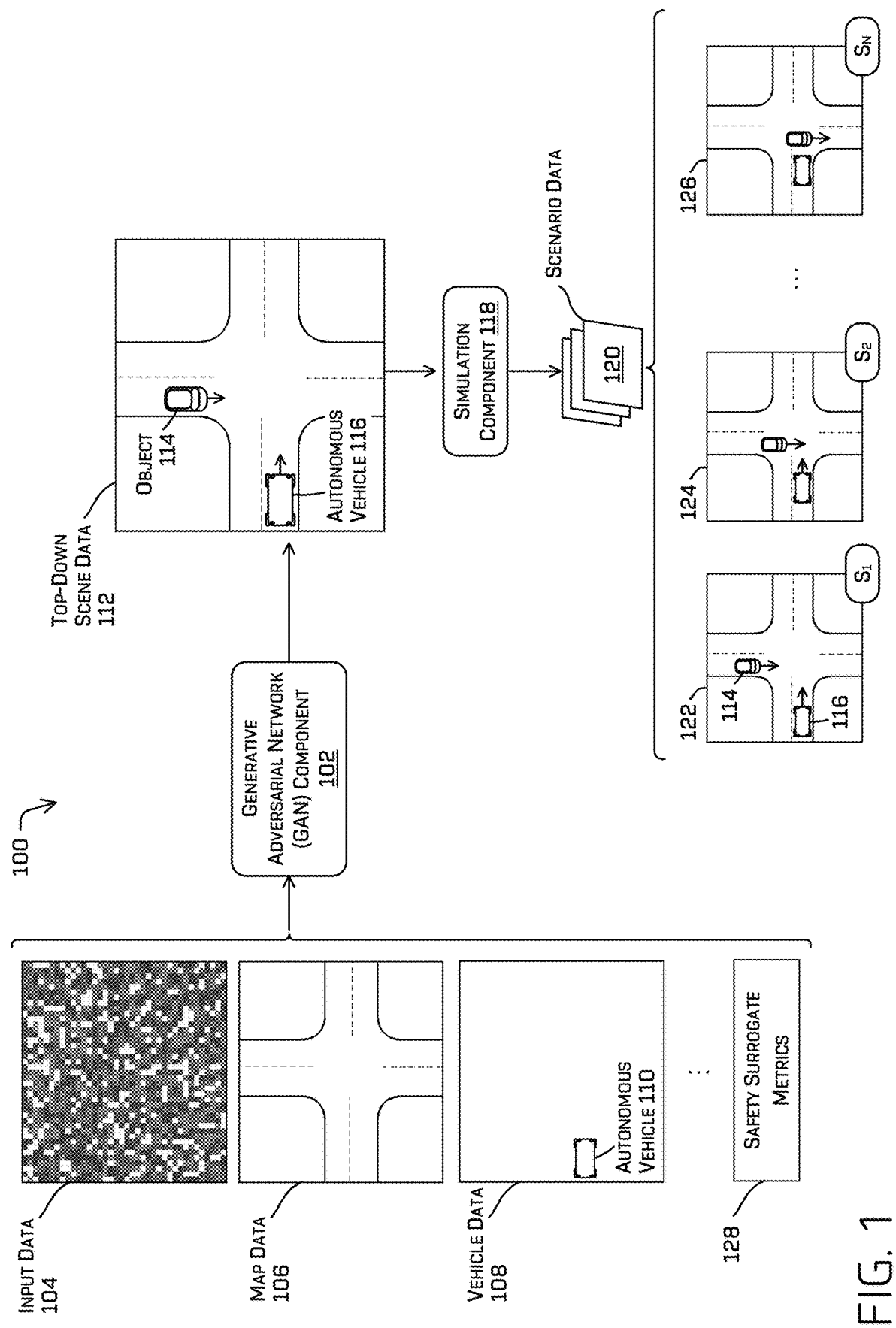
FIG. 1 is a schematic diagram illustrating an example implementation to generate top-down scene data based on various inputs, in accordance with examples of the disclosure.

This disclosure is directed to techniques for generating top-down scene data for use in testing or simulating autonomous driving systems in a variety of driving situations and environments. In some examples, a generator component receives two-dimensional input data and receives map data associated with an environment. Based on the two-dimensional input data and the map data, the generator component generates top-down scene data. A discriminator component evaluates the generated top-down scene data to determine whether the generated top-down scene is real or generated by the generator component. Feedback based on the evaluation is provided to the generator component to improve the quality of the top-down scenes it generates.

In some examples the generator component is a generative adversarial network (GAN) component. A GAN is a machine learning framework that uses multiple neural networks that compete with each other and, as a result of the competition, improve operation of the components in the network. As described herein, the generator component can compete with a discriminator component such that the operation of both the generator component and the discriminator component improve over time based on feedback of the competition to each component.

In some examples, a first convolutional neural network (CNN) can receive multi-dimensional input data and map data associated with an environment. A top-down scene can be generated using the first CNN and based at least in part on the multi-dimensional input data and the map data. Scene data that includes the generated top-down scene and a real top-down scene is input to a second CNN. The second CNN can create binary classification data indictive of the individual scene appearing to be generated or real. The binary classification data can be provided as a loss to the first CNN and the second CNN.

In some examples, the generated scene data may include object position data, object velocity data, and object state data, such as running/walking, vehicle lights, traffic light status, open door, and the like. In particular examples, a simulation scenario is generated based on the generated top-down scene. A response of a simulated vehicle controller is determined based at least in part on executing the simulation scenario.

In some examples, a system may receive scene data associated with an environment proximate a vehicle. A CNN can evaluate the received scene data and determines whether the received scene data is real scene data to a scene generated by a generator component. If the received scene data is determined to be generated by the generator component, the system can generate a caution notification indicating that a current environmental situation is different from any previous situations. The caution notification may be communicated to a vehicle system and/or a remote vehicle monitoring system.

The generated top-down scenes may be used when training or simulating an autonomous driving system. The generator component can generate any number of top-down scenes for training and simulation. These generated top-down scenes can be created faster and at a lower cost than capturing actual environment data using physical sensors and the like while still maintaining integrity (e.g., appearing to be a plausible scenario that may occur in a real environment). Additionally, the generator component can generate top-down scenes that are unusual and may be difficult to capture in an actual environment. Additionally, the generator component can generate specifically requested environments, such as low light on a wet roadway with multiple obstacles at specific locations. Thus, the generator component may create top-down scenes that address specific situations that need to be simulated or tested.

The techniques described herein can be implemented in a number of ways. Example implementations are provided below with reference to the following figures. Although discussed in the context of an autonomous vehicle, the methods, apparatuses, and systems described herein can be applied to a variety of systems and are not limited to autonomous vehicles. In another example, the techniques can be utilized in any type of vehicle, robotic system, or any system using data of the types described herein. Additionally, the techniques described herein can be used with real data (e.g., captured using sensor(s)), simulated data (e.g., generated by a simulator), or any combination of the two.

FIG. 1 is a schematic diagram illustrating an example implementation 100 to generate top-down scene data based on various inputs, in accordance with examples of the disclosure. As illustrated in FIG. 1, a generative adversarial network (GAN) component 102 receives one or more of input data 104, map data 106, or vehicle data 108. In some examples, input data 104 may be random two-dimensional input data (e.g., random two-dimensional vector data) that can be used as a seed during the training and/or operation of GAN component 102. As discussed herein, the training of GAN component 102 may teach it to generate top-down scenes that are highly realistic (e.g., for the purposes of simulation). In some examples, these scenes generated by GAN component 102 may be used as simulation environments (or scenarios) when simulating the operation of autonomous vehicles or other systems.

In some examples GAN component 102 may also receive safety surrogate metrics 128, which may include data related to adverse events such as collisions, "near collision" situations, or other dangerous situations associated with the input data 104, the map data 106, and/or the vehicle data 108. In particular examples, the safety surrogate metrics 128 may identify a safety risk, a degree of collision risk, a time to collision metric, or similar information. In some examples, when instructing GAN component 102 to generate scene data, the instructions may request scenes that are related to collisions or other dangerous situations.

Examples of generating and applying safety information and safety metrics are provided in U.S. patent application Ser. No. 17/210,101, titled "Fleet Dashcam System For Autonomous Vehicle Operation," filed Mar. 23, 2021, the entirety of which is herein incorporated by reference for all purposes.

As shown in FIG. 1, GAN component 102 may also receive map data 106 that can include various information related to an environment, such as an environment within which an autonomous vehicle may be operating. For example, map data 106 may include information related to objects in the environment, positions of the objects, direction of movement of the objects, velocity of the objects, roads in the environment, and the like. In some implementations, map data 106 may include information related to an autonomous vehicle navigating in the environment. Additionally, some map data 106 may include data from any number of autonomous vehicles, where the data is logged by the autonomous vehicles during their operation in different types of environments. The systems and methods described herein can generate any number of top-down scenes at any location on a map by varying the map data provided to GAN component 102.

Vehicle data 108 shown in FIG. 1 (also referred to as autonomous vehicle data) may include a position, direction of movement, speed, and/or historic information regarding the preceding of one or more autonomous vehicles 110. In some examples, vehicle data 108 can correspond to map data 106 and identifies a position of vehicle 110 within the environment described with respect to map data 106. In some examples, inputting the vehicle data 108 to the GAN 102 can condition the output of the GAN based on the vehicle 108 to provide more realistic scenarios.

As shown in FIG. 1, GAN component 102 can generate top-down scene data 112 based on one or more of input data 104, map data 106, or vehicle data 108. The top-down scene data 112 can be generated by GAN component 102 and does not necessarily represent an actual scene. Instead, the top-down scene data 112 can represent a hypothetical scene that can have characteristics that are highly realistic and may be used as simulation environments when simulating the operation of autonomous vehicles or other systems. As disclosed herein, top-down scene data 112 can be iteratively generated to provide a more realistic scene representation that can be congruent with logged scenario data and thus can emulate a realistic driving scene to a high level of confidence. In some examples, autonomous vehicles may be tested and simulated using the top-down scene data 112, which may be more efficient than capturing actual data using a vehicle or other system capable of capturing actual environments. In some examples, generating top-down scene data 112 can generate a variety of scenarios that are virtually limitless to expansively test a vehicle controller for safety validation. Additionally, GAN component 102 can generate top-down scene data 112 that may be difficult to capture in actual environments, such as unusual weather conditions, unusual traffic conditions, unusual object behavior, and the like.

In some examples, top-down scene data 112 may include occupancy and attribute information for objects within the generated top-down scene. In particular examples, top-down scene data 112 may include any type of data that may be contained in an actual captured top-down scene and/or any other data that may be useful in analyzing or evaluating the top-down scene. Additionally, top-down scene data 112 may include multi-channel image data or vectorized data.

In the example of FIG. 1, the top-down scene data 112 includes an object 114 and an autonomous vehicle 116. Both object 114 and autonomous vehicle 116 are illustrated as being on a roadway approaching the same intersection.

In some examples, the GAN component 102 may generate sensor data associated with one or more vehicles, such as autonomous vehicle 116. For example, the GAN component 102 may generate video data, still image data, radar data, lidar data, audio data, environmental data, or any other type of sensor data associated with the environment near a vehicle. In a particular example, the GAN component 102 may generate multiple streams of image data as might be captured by multiple image sensors positioned at different locations on the vehicle.

In some examples, the top-down scene data 112 may be provided to a simulation component 118 that can simulate operation of autonomous vehicles or other systems. Simulation component 118 can generate multiple discrete instances (e.g., frames) of scenario data 120 used in the simulation process. In some examples, scenario data 120 may include a sequence of frames showing a scene at different points in time. As shown in FIG. 1, scenario data 120 includes a first frame 122 at a first time, a second frame 124 at a second time, and a third frame 126 at a third time. The three frames 122, 124, and 126 show the same top-down scene data with object 114 and autonomous vehicle 116 at different times. For example, the first frame 122 shows object 114 and autonomous vehicle 116 as they are approaching an intersection. Both object 114 and autonomous vehicle 116 are moving toward the intersection as indicated by the arrows indicating the direction of travel. The second frame 124 shows object 114 and autonomous vehicle 116 at a later time, where object 114 has entered the intersection and autonomous vehicle 116 is still moving toward the intersection. The third frame 126 shows object 114 and autonomous vehicle 116 at a later time, where object 114 has continued traveling through the intersection and autonomous vehicle 116 has stopped short of the intersection (as indicated by a lack of an arrow associated with autonomous vehicle 116). In some examples, the three frames 122, 124, and 126 may represent at least a portion of a simulation.

Examples of generating scenario data are provided in U.S. patent application Ser. No. 16/457,679, titled "Synthetic Scenario Generator Based on Attributes," filed Jun. 28, 2019, the entirety of which is herein incorporated by reference for all purposes.

Figure 2:
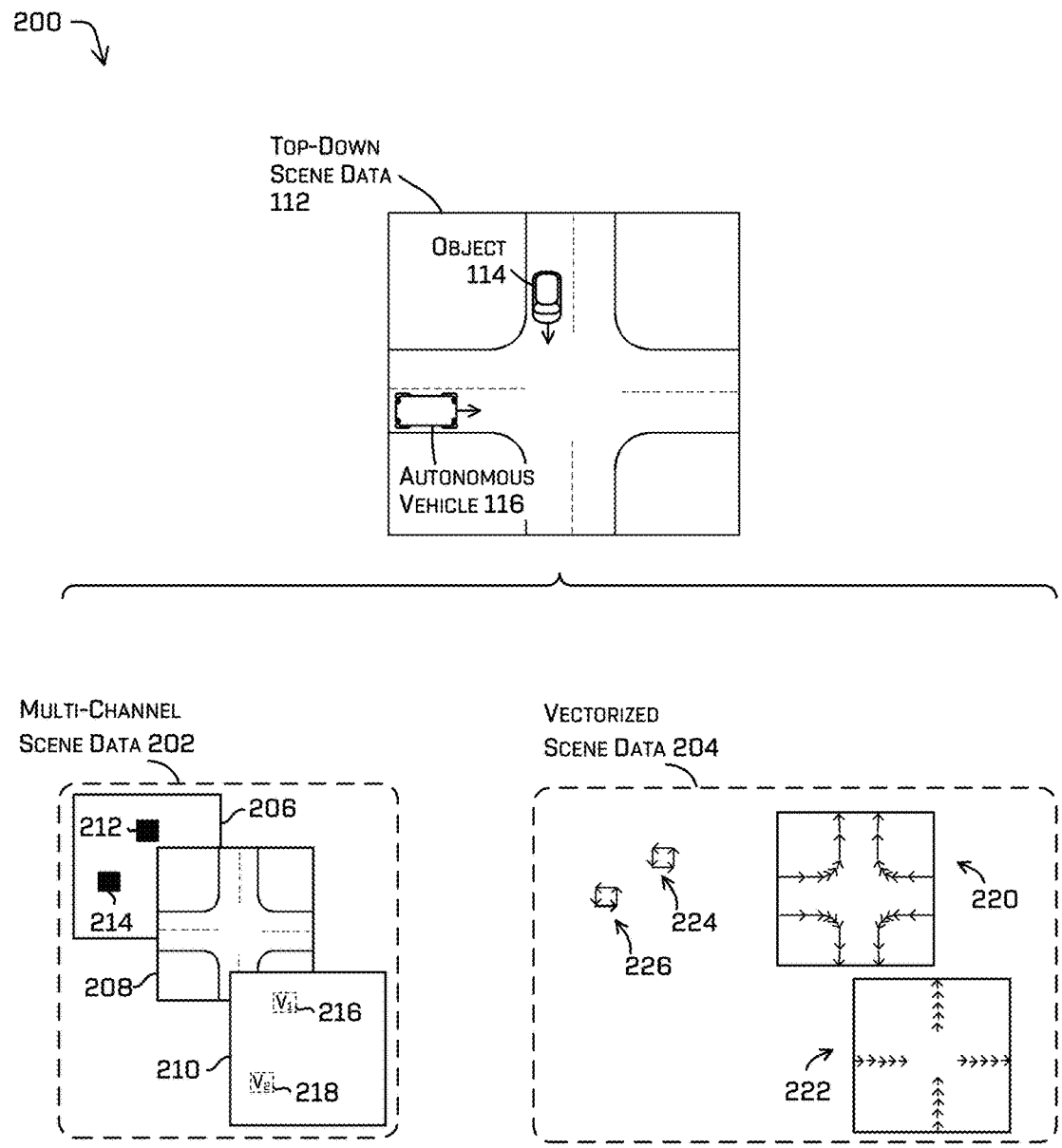
FIG. 2 is a schematic diagram illustrating an example implementation to generate top-down scene data based on multi-channel data and vectorized data, in accordance with examples of the disclosure.

FIG. 2 is a schematic diagram illustrating an example implementation 200 to generate top-down scene data based on multi-channel data and/or vectorized data, in accordance with examples of the disclosure. As illustrated in FIG. 2, top-down scene data 112 discussed above with respect to FIG. 1, may be created by GAN component 102 using one or both of multi-channel scene data 202 and vectorized scene data 204. In some examples, multi-channel scene data 202 represents portions of top-down scene data 112 with different types of information. As shown in FIG. 2, a first channel 206 shows object 114 as a block 212 and shows autonomous vehicle 116 as a block 214. These blocks 212 and 214 correspond to the location of object 114 and autonomous vehicle 116, respectively. A second channel 208 identifies a map that corresponds to the intersection shown in top-down scene data 112. A third channel 210 provides another representation of object 114 (represented as item 216) and autonomous vehicle 116 (represented as item 218).

In some examples, vectorized scene data 204 represents portions of top-down scene data 112 with vector information. As shown in FIG. 2, vectorized scene data 204 includes a first vector portion 220 that corresponds to the intersection shown in top-down scene data 112. A second vector portion 222 corresponds to the lanes in the intersection shown in top-down scene data 112. A third vector portion 224 corresponds to object 114 shown in top-down scene data 112. A fourth vector portion 226 corresponds to autonomous vehicle 116 shown in top-down scene data 112.

As discussed herein, GAN component 102 may receive multi-channel scene data 202 and/or vectorized scene data 204. GAN component 102 uses the received scene data (along with additional random two-dimensional data) to generate top-down scene data 112. In some examples, top-down scene data 112 may be partially based on multi-channel scene data 202 and/or vectorized scene data 204. But, top-down scene data 112 does not represent an actual scene. Instead, top-down scene data 112 can be a hypothetical scene with characteristics that are highly realistic.

Figure 3:
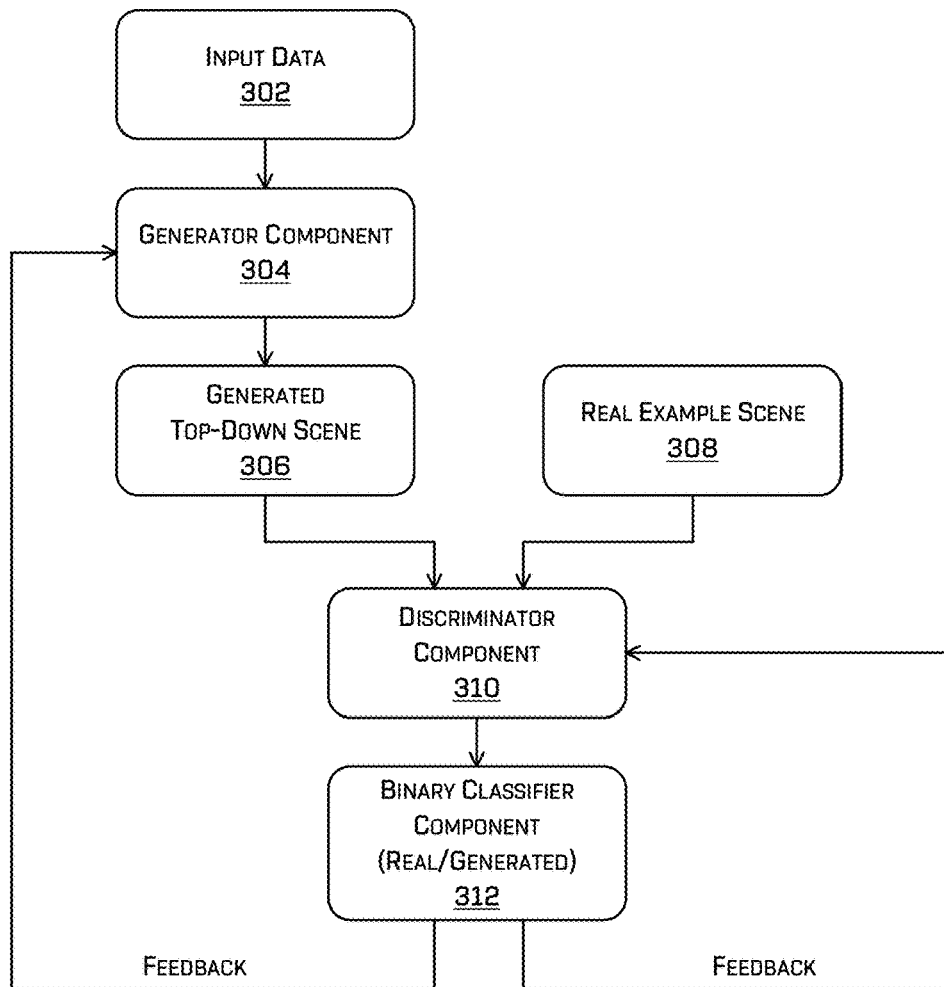
FIG. 3 illustrates an example process for training a generator and a discriminator, in accordance with examples of the disclosure.

FIG. 3 illustrates an example process 300 for training a generator and a discriminator, in accordance with examples of the disclosure. As illustrated in FIG. 3, input data 302 is provided to a generator component 304. In certain examples, input data 302 includes a random two-dimensional vector and map data. The map data may include, for example, a map rendering of an environment, object position information, object velocity information, and the like. The map data may also be randomized.

In some examples, generator component 304 is equivalent to GAN component 102 shown in FIG. 1. As shown in FIG. 3, generator component 304 generates a generated top-down scene 306 based on the input data 302. As discussed herein, the generator component 304 can generate any type of data and is not limited to generating top-down scene 306. For example, the generator component 304 may generate video data, still image data, radar data, lidar data, audio data, environmental data, or any other type of sensor data associated with the environment near a vehicle.

The generated top-down scene 306 can be provided to a discriminator component 310 which can evaluate the generated top-down scene 306 with a real example scene 308 to determine whether the generated top-down scene 306 appears to be real or generated (e.g., unrealistic). In some examples, discriminator component 310 is trained using the output of a binary classifier component 312. Since discriminator component 310 can be provided with both real and generated scene data, it learns to distinguish between real and generated scenes.

In some implementations, if the generated top-down scene 306 is similar to real example scene(s) 308, discriminator component 310 may be "tricked" into believing that the generated top-down scene 306 is a real scene. However, if the generated top-down scene 306 is not similar to real example scene(s) 308, the evaluation by discriminator component 310 may determine that the generated top-down scene 306 is a generated scene. The determination of discriminator component 310 (e.g., real or generated) is provided to the binary classifier component 312, which knows whether the generated top-down scene 306 is generated. In some examples, real example scene 308 is used as a ground truth for training purposes.

As shown in FIG. 3, binary classifier component 312 can provide feedback to generator component 304. This feedback may include whether discriminator component 310 was tricked into believing that the generated top-down scene 306 was real. This feedback provides confirmation to generator component 304 that the generated top-down scene 306 was highly realistic. Alternatively, if discriminator component 310 correctly identified the generated top-down scene 306 as generated, the generator component 304 learns from that feedback to improve the realism of future generated top-down scenes 306.

When generator component 304 is initially being trained, it may produce generated top-down scenes 306 that are not realistic. In some examples, generator component 304 continues to learn based on feedback from binary classifier component 312. Over time, generator component 304 will learn to produce more realistic generated top-down scenes 306 that are suitable for simulation and other purposes.

As illustrated in FIG. 3, binary classifier component 312 can provide feedback to discriminator component 310. This feedback may include whether discriminator component 310 correctly identified generated top-down scene 306 as real or generated. In some examples, discriminator component 310 continues to learn based on feedback from binary classifier component 312. Over time, discriminator component 310 will learn to more accurately evaluate particular top-down scenes as real or generated.

In some examples, discriminator component 310 implements a convolutional neural network that receives scene data and classifies the scene data as real or generated. Thus, the discriminator component 310 is trained to classify whether or not a scene comes from the same data as the training set. In some examples, generator component 304 and discriminator component 310 are trained simultaneously.

In some examples, during the training process, discriminator component 310 can be presented with half generated top-down scenes (as discussed above) and half real top-down scenes (or any ratio of generated and real scenes). A label associated with each top-down scene (both generated and real) can indicate whether the top-down scene is real or generated. When discriminator component 310 outputs an incorrect classification, a gradient may be computed and discriminator component 310 can be updated to improve its accuracy with future data.

Simultaneously, generator component 304 can be trained by considering scenes that discriminator component 310 classified as generated. Generator component 304 can use generated classification determination(s) to compute a loss and gradient which can, in turn, be used to improve generator component 304's accuracy. Thus, both discriminator component 310 and generator component 304 may be trained and can be adversarial to each other. This training of both discriminator component 310 and generator component 304 can continue, for example, until the loss for both components 310, 304 converges, at which point the generator component 304 may be considered as being trained.

In some examples, discriminator component 310 can be executed by an autonomous vehicle or a remote vehicle monitoring system to identify situations where the autonomous vehicle is in a situation that is unusual (e.g., out of the ordinary) based on previously captured or analyzed situations. This use of discriminator component 310 is discussed further with respect to FIG. 7.

Figure 4:
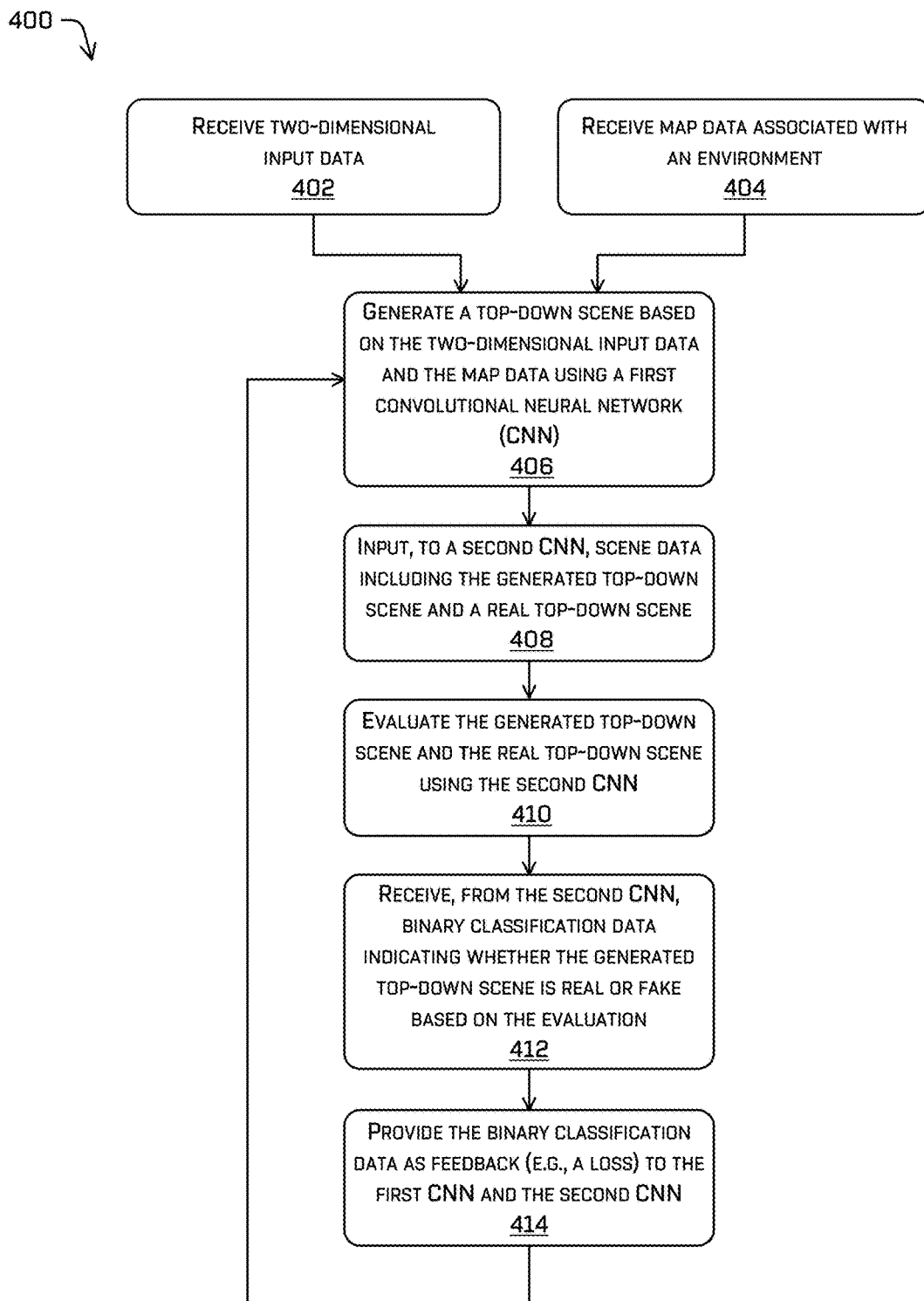
FIG. 4 illustrates an example process for generating a top-down scene and evaluating that scene to determine whether the generated top-down scene is real or generated, in accordance with examples of the disclosure.

FIG. 4 illustrates an example process 400 for generating a top-down scene and evaluating that scene to determine whether the generated top-down scene is real or generated, in accordance with examples of the disclosure. The operations described herein with respect to the process 400 may be performed by various components and systems, such as the components illustrated in FIGS. 1 and 3.

By way of example, the process 400 is illustrated as a logical flow graph, each operation of which represents a sequence of operations that can be implemented in hardware, software, or a combination thereof. In the context of software, the operations may represent computer-executable instructions stored on one or more computer-readable storage media that, when executed by one or more processors, perform the recited operations. Generally, computer-executable instructions may include routines, programs, objects, components, data structures, and the like that perform particular functions or implement particular abstract data types. The order in which the operations are described is not intended to be construed as a limitation, and any number of the described operations can be combined (or omitted) in any order and/or in parallel to implement the process 400. In some examples, multiple branches represent alternate implementations that may be used separately or in combination with other operations discussed herein.

At operation 402, the process may include receiving two-dimensional input data. In some examples, the received two-dimensional input data includes one or more random two-dimensional vectors.

At operation 404, the process may include receiving map data associated with an environment. In some examples, the map data includes information related to objects and roadways in the environment.

At operation 406, the process may include generating a top-down scene based on the two-dimensional input data and the map data using a first convolutional neural network (CNN). In some examples, the first CNN is associated with GAN component 102. In some examples, the first CNN is referred to as a generator component herein.

At operation 408, the process may include inputting, to a second CNN, scene data including the generated top-down scene and a real top-down scene. In some examples, the second CNN is referred to as a discriminator component herein.

At operation 410, the process may include evaluating the generated top-down scene and the real top-down scene using the second CNN. At operation 412, the process may include receiving, from the second CNN, binary classification data indicating whether the generated top-down scene is real or generated based on the evaluation performed at operation 410.

At operation 414, the process may include providing the binary classification data as feedback to the first CNN and the second CNN. In some examples, the feedback is identified as a loss to the first CNN and the second CNN.

Figure 5:
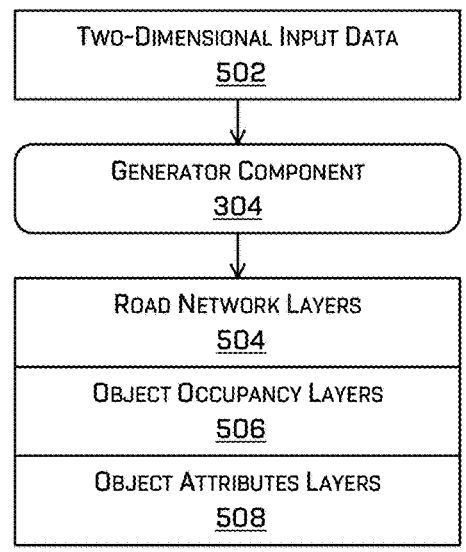
FIGS. 5 and 6 illustrate example procedures for processing inputs applied to a generator component and example outputs generated by the generator component based on the inputs, in accordance with examples of the disclosure.
Figure 6:
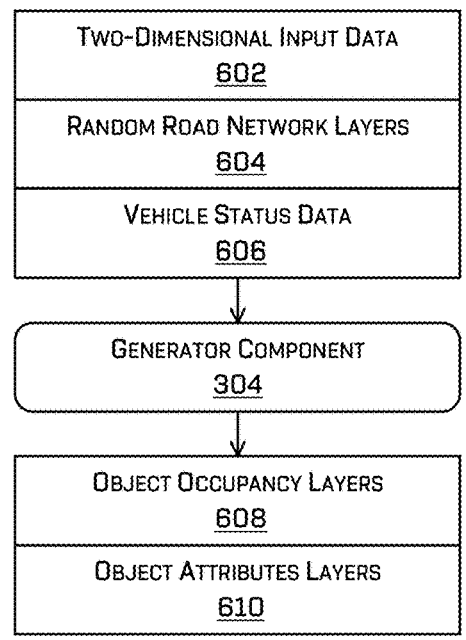

FIGS. 5 and 6 illustrate example procedures 500 and 600 for processing inputs applied to generator component 304 and example outputs generated by generator component 304 based on the inputs, in accordance with examples of the disclosure.

FIG. 5 illustrates an example process 500 in which generator component 304 receives two-dimensional input data 502 and generates road network layers 504, object occupancy layers 506, and object attributes layers 508 based on the two-dimensional input data 502. In some examples, the three generated layers (road network layers 504, object occupancy layers 506, and object attributes layers 508) represent the generated top-down scene. Although two-dimensional input data 502 is shown in FIG. 5, in some examples, the input data to generator component 304 can be multi-dimensional (e.g., N-dimensional). When applying multi-dimensional input to generator component 304, the output from generator component 304 may have the same number of dimensions.

As discussed herein, additional types of data may be provided to generator component 304 and are not limited to two-dimensional or multi-dimensional input data 502.

FIG. 6 illustrates an example process 600 in which generator component 304 receives two-dimensional input data 602, random road network layers 604, and vehicle status data 606. Vehicle status data 606 can include historic or current autonomous vehicle position, speed, direction information. Based on the two-dimensional input data 602, random road network layers 604, and vehicle status data 606, the generator component 304 generates object occupancy layers 608 and object attributes layers 610. Any combination of two-dimensional input data 602, random road network layers 604, and vehicle status data 606 can optionally be provided to generator component 304. In certain examples, generator component 304 may generate and randomize data corresponding to any of two-dimensional input data 602, random road network layers 604, or vehicle status data 606.

Although two-dimensional input data 602 is shown in FIG. 6, in some examples, the input data to generator component 304 can be multi-dimensional (e.g., N-dimensional). When applying multi-dimensional input to generator component 304, the output from generator component 304 may have the same number of dimensions.

As discussed herein, additional types of data may be provided to generator component 304 and are not limited to two-dimensional input data 602, random road network layers 604, and vehicle status data 606.

Figure 7:
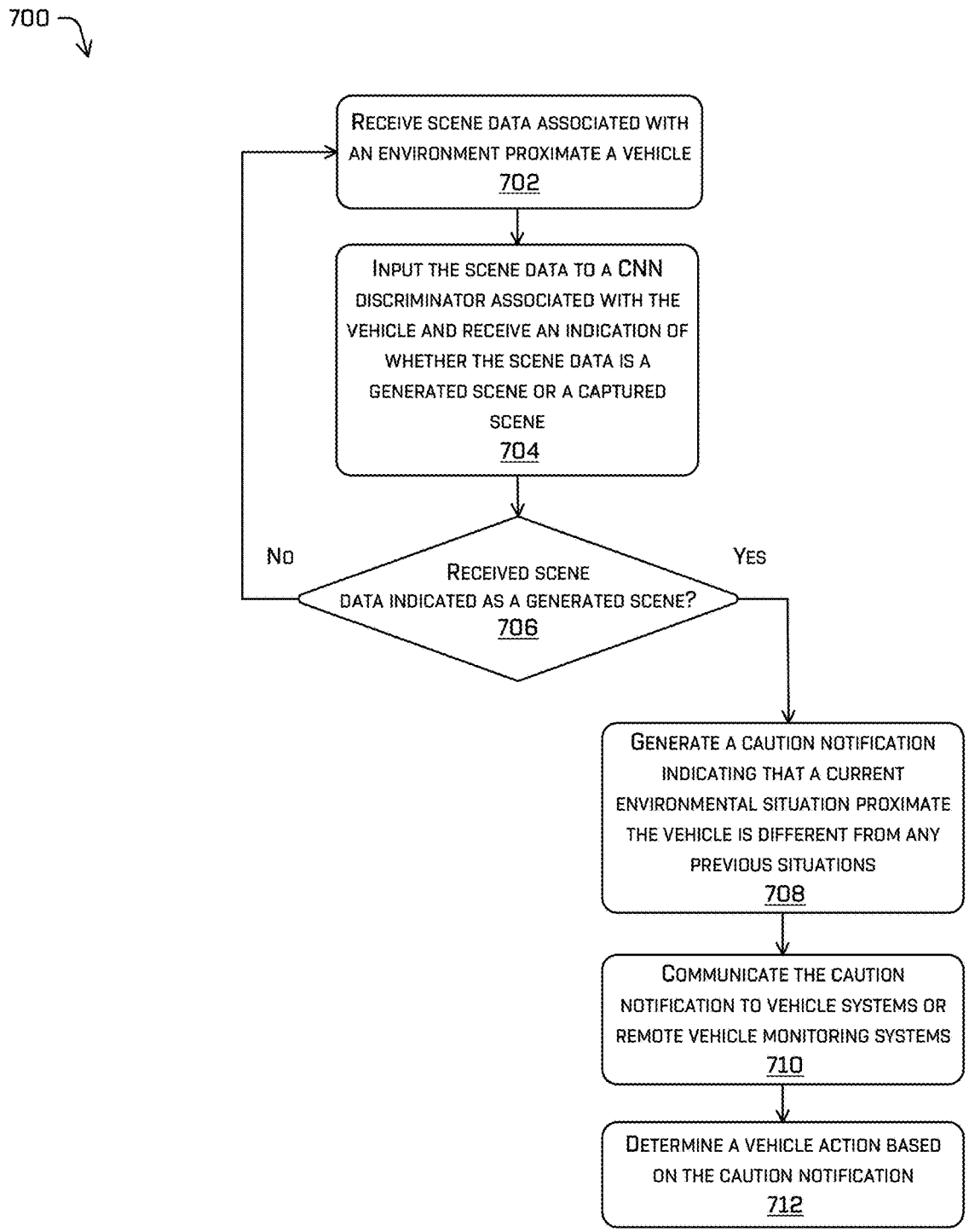
FIG. 7 illustrates an example process for comparing scene data proximate a vehicle with previously analyzed scene data to identify out of the ordinary situations, in accordance with examples of the disclosure.

FIG. 7 illustrates an example process 700 for comparing scene data proximate a vehicle with previously analyzed scene data to identify out of the ordinary situations, in accordance with examples of the disclosure. The operations described herein with respect to the process 700 may be performed by various components and systems, such as the components illustrated in FIGS. 1 and 3.

By way of example, the process 700 is illustrated as a logical flow graph, each operation of which represents a sequence of operations that can be implemented in hardware, software, or a combination thereof. In the context of software, the operations may represent computer-executable instructions stored on one or more computer-readable storage media that, when executed by one or more processors, perform the recited operations. Generally, computer-executable instructions may include routines, programs, objects, components, data structures, and the like that perform particular functions or implement particular abstract data types. The order in which the operations are described is not intended to be construed as a limitation, and any number of the described operations can be combined (or omitted) in any order and/or in parallel to implement the process 700. In some examples, multiple branches represent alternate implementations that may be used separately or in combination with other operations discussed herein.

At operation 702, the process may include receiving scene data associated with an environment proximate a vehicle. In some examples, the received scene data may be generated by a first CNN. In other examples, scene data may be obtained using one or more sensors associated with a vehicle.

At operation 704, the process may include inputting the scene data to a CNN discriminator associated with the vehicle. In some examples, the CNN discriminator was trained using a generator and a classification of the output of the CNN discriminator. Operation 704 may also receive an indication of whether the scene data is a generated scene or a captured scene.

At operation 706, the process may determine whether the scene data was indicated as a generated scene. If the received scene data is not indicated as a generated scene, then the process may return to 702 to receive the next scene data. In this situation, the received scene data is similar to previously analyzed scene data and, therefore, is not out of the ordinary.

If, at operation 706, the process determines that the received scene data is indicated as a generated scene, then the received scene data is out of the ordinary and the process branches to operation 708. At operation 708, the process may include generating a caution notification indicating that a current environmental situation proximate the vehicle is different from any previous situations. In certain examples, operation 706 can be performed by a discriminator component that has been trained as described herein.

At operation 710, the process may include communicating the caution notification to vehicle systems or remote vehicle monitoring systems. Since the current environmental situation is sufficiently different from any previous situations, the vehicle may need increased supervision to operate in a more cautious mode because it is navigating an out of the ordinary situation. In some examples, communicating the caution notification may include inputting an indication of the scene to a planning system associated with the vehicle. For example, the indication of the scene may indicate a high caution mode.

Examples of systems and methods that provide guidance to a driverless vehicle are provided in U.S. Pat. No. 10,564,638, titled "Teleoperator Situational Awareness," filed Jul. 7, 2017, the entirety of which is herein incorporated by reference for all purposes.

At operation 712, the process may include determining a vehicle action based on the caution notification. For example, the vehicle action may include controlling the vehicle (e.g., slowing down, increasing distance between objects and the vehicle in the environment), updating map data, identifying objects proximate the vehicle, adjusting confidence levels for various algorithms (e.g., classification algorithms, prediction algorithms, etc.), modifying a vehicle trajectory, slowing the vehicle, stopping the vehicle, and the like.

In some examples, process 700 may, in response to determining that the received scene data is different from any previously received scene data, instruct the vehicle to log data associated with a vehicle status, log data associated with the environment proximate the vehicle, log the scene data, and the like. Additionally, process 700 may determine a risk associated with the scene data and train the first CNN based on the risk. As discussed herein, the first CNN may be a discriminator component of a trained GAN. In some examples, process 700 can receive sensor data from one or more sensors associated with the vehicle and determine the scene data based at least in part on the sensor data. In some implementations, a request for a command may be transmitted to a remote computing device, where the requested command may include a vehicle instruction or command related to a vehicle activity. In some examples, process 700 may input the indication of the scene to a prediction system associated with the vehicle along with the scene data, such that the indication may be used for future (e.g., downstream) processing.

Figure 8:
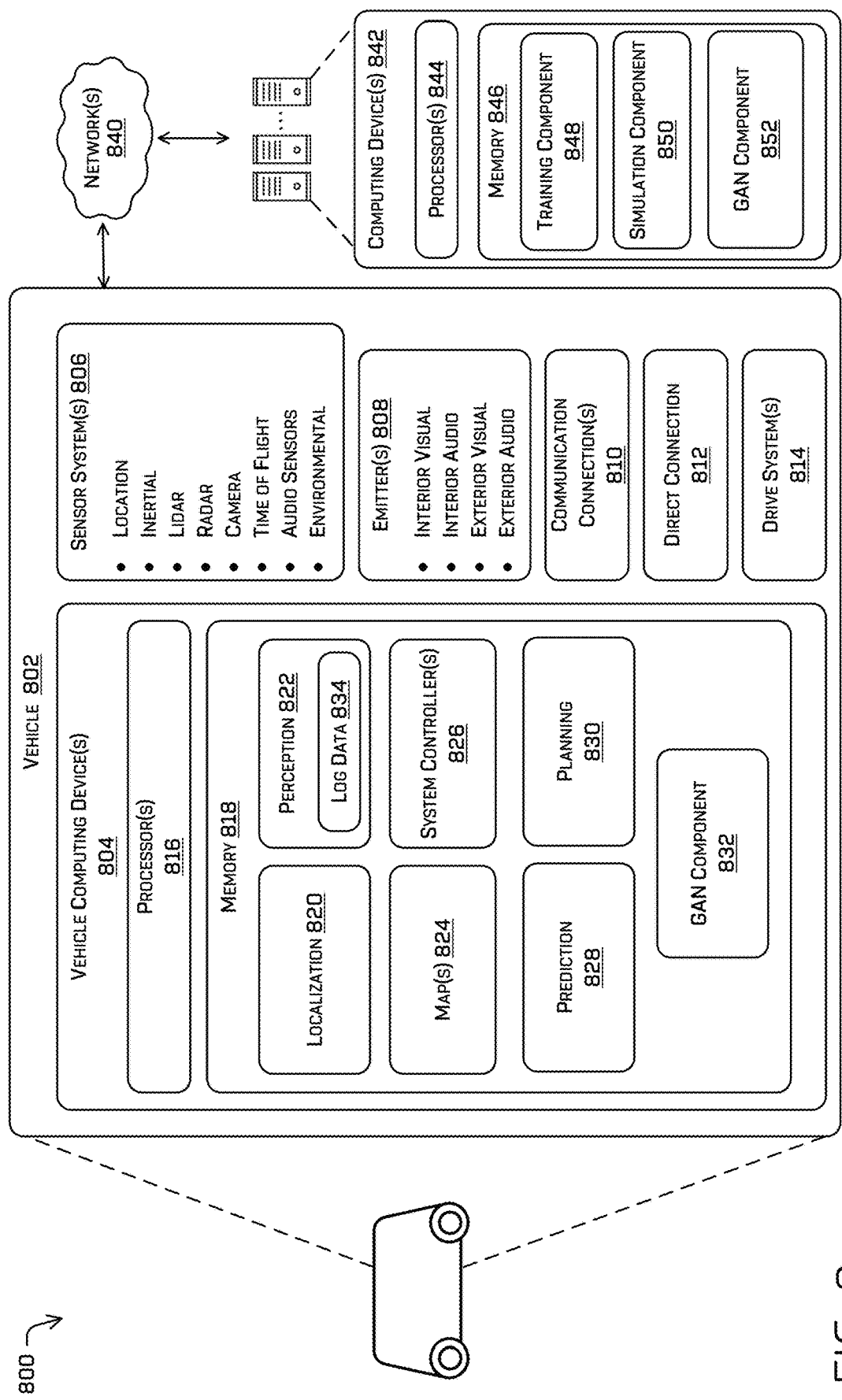
FIG. 8 is an illustration of an example system for implementing the techniques described herein.

FIG. 8 depicts a block diagram of an example system 800 for implementing the techniques described herein. The vehicle 802 may include one or more vehicle computing devices 804 (also referred to as a vehicle computing device 804 or vehicle computing device(s) 804), one or more sensor systems 806, one or more emitters 808, one or more communication connections 810, at least one direct connection 812, and one or more drive systems 814.

The vehicle computing device 804 may include one or more processors 816 and memory 818 communicatively coupled with the one or more processors 816. In the illustrated example, the vehicle 802 is an autonomous vehicle; however, the vehicle 802 could be any other type of vehicle. In the illustrated example, the memory 818 of the vehicle computing device 804 stores a localization component 820, a perception component 822, one or more maps 824, one or more system controllers 826, a prediction component 828, a planning component 830, and a GAN component 832. Though depicted in FIG. 8 as residing in memory 818 for illustrative purposes, it is contemplated that the localization component 820, the perception component 822, the one or more maps 824, the one or more system controllers 826, the prediction component 828, the planning component 830, and the GAN component 832 may additionally, or alternatively, be accessible to the vehicle 802 (e.g., stored remotely).

In at least one example, the localization component 820 may include functionality to receive data from the sensor system(s) 806 to determine a position and/or orientation of the vehicle 802 (e.g., one or more of an x-, y-, z-position, roll, pitch, or yaw). For example, the localization component 820 may include and/or request/receive a map of an environment and may continuously determine a location and/or orientation of the autonomous vehicle within the map. In some instances, the localization component 820 may utilize SLAM (simultaneous localization and mapping), CLAMS (calibration, localization and mapping, simultaneously), relative SLAM, bundle adjustment, non-linear least squares optimization, or the like to receive image data, lidar data, radar data, IMU data, GPS data, wheel encoder data, and the like to accurately determine a location of the autonomous vehicle. In some instances, the localization component 820 may provide data to various components of the vehicle 802 to determine an initial position of an autonomous vehicle for generating a trajectory and/or for generating or receiving map data, as discussed herein.

In some instances, the perception component 822 may include functionality to perform object detection, segmentation, and/or classification. In some examples, the perception component 822 may provide processed sensor data that indicates a presence of an entity that is proximate to the vehicle 802 and/or a classification of the entity as an entity type (e.g., car, pedestrian, cyclist, animal, building, tree, road surface, curb, sidewalk, unknown, etc.). In additional or alternative examples, the perception component 822 may provide processed sensor data that indicates one or more characteristics associated with a detected entity (e.g., a tracked object) and/or the environment in which the entity is positioned. In some examples, characteristics associated with an entity may include, but are not limited to, an x-position (global and/or local position), a y-position (global and/or local position), a z-position (global and/or local position), an orientation (e.g., a roll, pitch, yaw), an entity type (e.g., a classification), a velocity of the entity, an acceleration of the entity, an extent of the entity (size), etc. Characteristics associated with the environment may include, but are not limited to, a presence of another entity in the environment, a state of another entity in the environment, a time of day, a day of a week, a season, a weather condition, an indication of darkness/light, etc. As shown in FIG. 8, perception component 822 may include log data 834 that represents various data captured by systems and sensors of vehicle 802 and stored for future reference, such as analysis and simulation activities.

The memory 818 may further include one or more maps 824 that may be used by the vehicle 802 to navigate within the environment. For the purpose of this discussion, a map may be any number of data structures modeled in two dimensions, three dimensions, or N-dimensions that are capable of providing information about an environment, such as, but not limited to, topologies (such as intersections), streets, mountain ranges, roads, terrain, and the environment in general. In some instances, a map may include, but is not limited to: texture information (e.g., color information (e.g., RGB color information, Lab color information, HSV/HSL color information), and the like), intensity information (e.g., LIDAR information, RADAR information, and the like); spatial information (e.g., image data projected onto a mesh, individual "surfels" (e.g., polygons associated with individual color and/or intensity)), reflectivity information (e.g., specularity information, retroreflectivity information, BRDF information, BSSRDF information, and the like). In one example, a map may include a three-dimensional mesh of the environment. In some instances, the map may be stored in a tiled format, such that individual tiles of the map represent a discrete portion of an environment, and may be loaded into working memory as needed, as discussed herein. In at least one example, the one or more maps 824 may include at least one map (e.g., images and/or a mesh). In some examples, the vehicle 802 may be controlled based at least in part on the map(s) 824. In some examples, the one or more maps 824 may be stored on a remote computing device(s) (such as the computing device(s) 842) accessible via network(s) 840. In some examples, multiple maps 824 may be stored based on, for example, a characteristic (e.g., type of entity, time of day, day of week, season of the year, etc.). Storing multiple maps 824 may have similar memory requirements but increase the speed at which data in a map may be accessed.

In at least one example, the vehicle computing device 804 may include one or more system controllers 826, which may be configured to control steering, propulsion, braking, safety, emitters, communication, and other systems of the vehicle 802. These system controller(s) 826 may communicate with and/or control corresponding systems of the drive system(s) 814 and/or other components of the vehicle 802.

In some examples, the prediction component 828 may include functionality to generate one or more probability maps representing prediction probabilities of possible locations of one or more objects in an environment. For example, the prediction component 828 can generate one or more probability maps for vehicles, pedestrians, animals, and the like within a threshold distance from the vehicle 802. In some instances, the prediction component 828 can measure a track of an object and generate a discretized prediction probability map, a heat map, a probability distribution, a discretized probability distribution, and/or a trajectory for the object based on observed and predicted behavior. In some instances, the one or more probability maps can represent an intent of the one or more objects in the environment.

In some examples, the planning component 830 may include functionality to determine a path for the vehicle 802 to follow to traverse through an environment. For example, the planning component 830 can determine various routes and paths and various levels of detail. In some instances, the planning component 830 can determine a route to travel from a first location (e.g., a current location) to a second location (e.g., a target location). For the purpose of this discussion, a route can be a sequence of waypoints for traveling between two locations. As non-limiting examples, waypoints include streets, intersections, global positioning system (GPS) coordinates, etc. Further, the planning component 830 can generate an instruction for guiding the autonomous vehicle along at least a portion of the route from the first location to the second location. In at least one example, the planning component 830 can determine how to guide the autonomous vehicle from a first waypoint in the sequence of waypoints to a second waypoint in the sequence of waypoints. In some examples, the instruction can be a path, or a portion of a path. In some examples, multiple paths can be substantially simultaneously generated (i.e., within technical tolerances) in accordance with a receding horizon technique. A single path of the multiple paths in a receding data horizon having the highest confidence level may be selected to operate the vehicle.

In other examples, the planning component 830 can alternatively, or additionally, use data from the perception component 822 and/or the prediction component 828 to determine a path for the vehicle 802 to follow to traverse through an environment. For example, the planning component 830 can receive data from the perception component 822 and/or the prediction component 828 regarding objects associated with an environment. Using this data, the planning component 830 can determine a route to travel from a first location (e.g., a current location) to a second location (e.g., a target location) to avoid objects in an environment. In at least some examples, such a planning component 830 may determine there is no such collision free path and, in turn, provide a path which brings vehicle 802 to a safe stop avoiding all collisions and/or otherwise mitigating damage.

In some examples, the GAN component 832 may include functionality to evaluate generated top-down scene data with real example scene data to determine whether the generated top-down scene is real or generated, as discussed herein.

In some instances, aspects of some or all of the components discussed herein may include any models, algorithms, and/or machine learning algorithms. For example, in some instances, the components in the memory 818 (and the memory 846, discussed below) may be implemented as a neural network.

As described herein, an exemplary neural network is an algorithm which passes input data through a series of connected layers to produce an output. Each layer in a neural network may also comprise another neural network or may comprise any number of layers (whether convolutional or not). As may be understood in the context of this disclosure, a neural network may utilize machine learning, which may refer to a broad class of such algorithms in which an output is generated based on learned parameters.

Although discussed in the context of neural networks, any type of machine learning may be used consistent with this disclosure. For example, machine learning algorithms may include, but are not limited to, regression algorithms (e.g., ordinary least squares regression (OLSR), linear regression, logistic regression, stepwise regression, multivariate adaptive regression splines (MARS), locally estimated scatterplot smoothing (LOESS)), instance-based algorithms (e.g., ridge regression, least absolute shrinkage and selection operator (LASSO), elastic net, least-angle regression (LARS)), decisions tree algorithms (e.g., classification and regression tree (CART), iterative dichotomiser 3 (ID3), Chi-squared automatic interaction detection (CHAID), decision stump, conditional decision trees), Bayesian algorithms (e.g., naïve Bayes, Gaussian naïve Bayes, multinomial naïve Bayes, average one-dependence estimators (AODE), Bayesian belief network (BNN), Bayesian networks), clustering algorithms (e.g., k-means, k-medians, expectation maximization (EM), hierarchical clustering), association rule learning algorithms (e.g., perceptron, back-propagation, hopfield network, Radial Basis Function Network (RBFN)), deep learning algorithms (e.g., Deep Boltzmann Machine (DBM), Deep Belief Networks (DBN), Convolutional Neural Network (CNN), Stacked Auto-Encoders), Dimensionality Reduction Algorithms (e.g., Principal Component Analysis (PCA), Principal Component Regression (PCR), Partial Least Squares Regression (PLSR), Sammon Mapping, Multidimensional Scaling (MDS), Projection Pursuit, Linear Discriminant Analysis (LDA), Mixture Discriminant Analysis (MDA), Quadratic Discriminant Analysis (QDA), Flexible Discriminant Analysis (FDA)), Ensemble Algorithms (e.g., Boosting, Bootstrapped Aggregation (Bagging), AdaBoost, Stacked Generalization (blending), Gradient Boosting Machines (GBM), Gradient Boosted Regression Trees (GBRT), Random Forest), SVM (support vector machine), supervised learning, unsupervised learning, semi-supervised learning, etc.

Additional examples of architectures include neural networks such as ResNet50, ResNet101, VGG, DenseNet, PointNet, and the like.

In at least one example, the sensor system(s) 806 may include lidar sensors, radar sensors, ultrasonic transducers, sonar sensors, location sensors (e.g., GPS, compass, etc.), inertial sensors (e.g., inertial measurement units (IMUs), accelerometers, magnetometers, gyroscopes, etc.), cameras (e.g., RGB, IR, intensity, depth, etc.), time of flight sensors, audio sensors, wheel encoders, environment sensors (e.g., temperature sensors, humidity sensors, light sensors, pressure sensors, etc.), etc. The sensor system(s) 806 may include multiple instances of each of these or other types of sensors. For instance, the lidar sensors may include individual lidar sensors located at the corners, front, back, sides, and/or top of the vehicle 802. As another example, the camera sensors may include multiple cameras disposed at various locations about the exterior and/or interior of the vehicle 802. The sensor system(s) 806 may provide input to the vehicle computing device 804. Additionally, or alternatively, the sensor system(s) 806 may send sensor data, via the one or more networks 840, to the one or more computing device(s) at a particular frequency, after a lapse of a predetermined period of time, in near real-time, etc.

The vehicle 802 may also include one or more emitters 808 for emitting light and/or sound, as described above. The emitters 808 in this example include interior audio and visual emitters to communicate with passengers of the vehicle 802. By way of example and not limitation, interior emitters may include speakers, lights, signs, display screens, touch screens, haptic emitters (e.g., vibration and/or force feedback), mechanical actuators (e.g., seatbelt tensioners, seat positioners, headrest positioners, etc.), and the like. The emitters 808 in this example also include exterior emitters. By way of example and not limitation, the exterior emitters in this example include lights to signal a direction of travel or other indicator of vehicle action (e.g., indicator lights, signs, light arrays, etc.), and one or more audio emitters (e.g., speakers, speaker arrays, horns, etc.) to audibly communicate with pedestrians or other nearby vehicles, one or more of which comprising acoustic beam steering technology.

The vehicle 802 may also include one or more communication connection(s) 810 that enable communication between the vehicle 802 and one or more other local or remote computing device(s). For instance, the communication connection(s) 810 may facilitate communication with other local computing device(s) on the vehicle 802 and/or the drive system(s) 814. Also, the communication connection(s) 810 may allow the vehicle to communicate with other nearby computing device(s) (e.g., other nearby vehicles, traffic signals, etc.). The communications connection(s) 810 also enable the vehicle 802 to communicate with a remote teleoperation computing device or other remote services.

The communications connection(s) 810 may include physical and/or logical interfaces for connecting the vehicle computing device 804 to another computing device or a network, such as network(s) 840. For example, the communications connection(s) 810 may enable Wi-Fi-based communication such as via frequencies defined by the IEEE 802.11 standards, short range wireless frequencies such as Bluetooth, cellular communication (e.g., 2G, 3G, 4G, 4G LTE, 5G, etc.) or any suitable wired or wireless communications protocol that enables the respective computing device to interface with the other computing device(s).

In at least one example, the vehicle 802 may include one or more drive systems 814. In some examples, the vehicle 802 may have a single drive system 814. In at least one example, if the vehicle 802 has multiple drive systems 814, individual drive systems 814 may be positioned on opposite ends of the vehicle 802 (e.g., the front and the rear, etc.). In at least one example, the drive system(s) 814 may include one or more sensor systems to detect conditions of the drive system(s) 814 and/or the surroundings of the vehicle 802. By way of example and not limitation, the sensor system(s) may include one or more wheel encoders (e.g., rotary encoders) to sense rotation of the wheels of the drive systems, inertial sensors (e.g., inertial measurement units, accelerometers, gyroscopes, magnetometers, etc.) to measure orientation and acceleration of the drive system, cameras or other image sensors, ultrasonic sensors to acoustically detect objects in the surroundings of the drive system, lidar sensors, radar sensors, etc. Some sensors, such as the wheel encoders may be unique to the drive system(s) 814. In some cases, the sensor system(s) on the drive system(s) 814 may overlap or supplement corresponding systems of the vehicle 802 (e.g., sensor system(s) 806).

The drive system(s) 814 may include many of the vehicle systems, including a high voltage battery, a motor to propel the vehicle, an inverter to convert direct current from the battery into alternating current for use by other vehicle systems, a steering system including a steering motor and steering rack (which may be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive system(s) 814 may include a drive system controller which may receive and preprocess data from the sensor system(s) and to control operation of the various vehicle systems. In some examples, the drive system controller may include one or more processors and memory communicatively coupled with the one or more processors. The memory may store one or more components to perform various functionalities of the drive system(s) 814. Furthermore, the drive system(s) 814 also include one or more communication connection(s) that enable communication by the respective drive system with one or more other local or remote computing device(s).

In at least one example, the direct connection 812 may provide a physical interface to couple the one or more drive system(s) 814 with the body of the vehicle 802. For example, the direct connection 812 may allow the transfer of energy, fluids, air, data, etc. between the drive system(s) 814 and the vehicle. In some instances, the direct connection 812 may further releasably secure the drive system(s) 814 to the body of the vehicle 802.

In some examples, the vehicle 802 may send sensor data to one or more computing device(s) 842 via the network(s) 840. In some examples, the vehicle 802 may send raw sensor data to the computing device(s) 842. In other examples, the vehicle 802 may send processed sensor data and/or representations of sensor data to the computing device(s) 842. In some examples, the vehicle 802 may send sensor data to the computing device(s) 842 at a particular frequency, after a lapse of a predetermined period of time, in near real-time, etc. In some cases, the vehicle 802 may send sensor data (raw or processed) to the computing device(s) 842 as one or more log files. The computing device(s) 842 may include processor(s) 844 and a memory 846 storing a training component 848, a simulation component 850, and a GAN component 852.

In some examples, the training component 848 may include training data that has been generated by a simulator. For example, simulated training data may represent examples where testing audio sources in an environment, to provide additional training examples.

In some examples, the simulation component 850 may simulate the operation of autonomous vehicles or other systems, as discussed herein. In particular examples, the GAN component 852 may evaluate generated top-down scene data with real example scene data to determine whether the generated top-down scene is real or generated, as discussed herein.

The processor(s) 816 of the vehicle 802 and the processor(s) 844 of the computing device(s) 842 may be any suitable processor capable of executing instructions to process data and perform operations as described herein. By way of example and not limitation, the processor(s) 816 and 844 may comprise one or more Central Processing Units (CPUs), Graphics Processing Units (GPUs), or any other device or portion of a device that processes electronic data to transform that electronic data into other electronic data that may be stored in registers and/or memory. In some examples, integrated circuits (e.g., ASICs, etc.), gate arrays (e.g., FPGAs, etc.), and other hardware devices may also be considered processors in so far as they are configured to implement encoded instructions.

Memory 818 and 846 are examples of non-transitory computer-readable media. The memory 818 and 846 may store an operating system and one or more software applications, instructions, programs, and/or data to implement the methods described herein and the functions attributed to the various systems. In various implementations, the memory may be implemented using any suitable memory technology, such as static random-access memory (SRAM), synchronous dynamic RAM (SDRAM), nonvolatile/Flash-type memory, or any other type of memory capable of storing information. The architectures, systems, and individual elements described herein may include many other logical, programmatic, and physical components, of which those shown in the accompanying figures are merely examples that are related to the discussion herein.

In some instances, the memory 818 and 846 may include at least a working memory and a storage memory. For example, the working memory may be a high-speed memory of limited capacity (e.g., cache memory) that is used for storing data to be operated on by the processor(s) 816 and 844. In some instances, the memory 818 and 846 may include a storage memory that may be a lower-speed memory of relatively large capacity that is used for long-term storage of data. In some cases, the processor(s) 816 and 844 may not operate directly on data that is stored in the storage memory, and data may need to be loaded into a working memory for performing operations based on the data, as discussed herein.

It should be noted that while FIG. 8 is illustrated as a distributed system, in alternative examples, components of the vehicle 802 may be associated with the computing device(s) 842 and/or components of the computing device(s) 842 may be associated with the vehicle 802. That is, the vehicle 802 may perform one or more of the functions associated with the computing device(s) 842, and vice versa.

Example Clauses

A. A system comprising: one or more processors; and one or more non-transitory computer-readable media storing instructions executable by the one or more processors, wherein the instructions, when executed, cause the system to perform operations comprising: receiving, at a first convolutional neural network (CNN), two-dimensional input data and map data of an environment; generating, using the first CNN and based at least in part on the two-dimensional input data and the map data, a generated top-down scene including occupancy and attribute information for objects within the generated top-down scene; inputting, to a second CNN, scene data comprising the generated top-down scene and a real top-down scene including occupancy and attribute information for objects within the real top-down scene; receiving, from the second CNN, binary classification data indicative of whether an individual scene in the scene data is classified as generated or classified as captured; and providing the binary classification data as a loss to the first CNN and the second CNN.

B. The system of paragraph A, wherein: the attribute information for objects within the generated top-down scene includes at least one of object position data, object velocity data, or object state data.

C. The system of paragraph A or B, the operations further comprising: generating a simulation scenario based on the generated top-down scene; and determining a response of a simulated vehicle controller based at least in part on executing the simulation scenario.

D. The system of any of paragraphs A-C, wherein: the generated top-down scene includes at least one of multi-channel image data or vectorized data.

E. The system of any of paragraphs A-D, the operations further comprising: providing safety surrogate metrics to the first CNN to condition the generated top-down scene.

F. A method, comprising: receiving, at a generator component, multi-dimensional input data; generating, using the generator component and based at least in part on the multi-dimensional input data, a generated top-down scene; inputting, to a discriminator component, scene data comprising the generated top-down scene and a real top-down scene; receiving, from the discriminator component, binary classification data indicative of whether an individual scene in the scene data is classified as generated or classified as captured; and providing the binary classification data as a loss to the generator component and the discriminator component.

G. The method of paragraph F, wherein: the generated top-down scene includes object position data associated with an object and velocity data associated with the object.

H. The method of paragraph F or G, further comprising: generating a simulation scenario based on the generated top-down scene; and determining a response of a simulated vehicle controller based at least in part on executing the simulation scenario.

I. The method of any of paragraphs F-H, wherein: the generated top-down scene includes at least one of multi-channel image data or vectorized data.

J. The method of any of paragraphs F-I, further comprising: providing autonomous vehicle data to the generator component to generate the generated top-down scene.

K. The method of paragraph J, further comprising: conditioning the generated top-down scene based on a state of an autonomous vehicle.

L. The method of any of paragraphs F-K, wherein: the generator component includes a first convolutional neural network (CNN).

M. The method of any of paragraphs F-L, wherein: the discriminator component includes a second CNN.

N. The method of any of paragraphs F-M, further comprising: inputting map data to the generator component, wherein the map data includes information related to objects and roadways in an environment.

O. The method of any of paragraphs F-N, wherein: the multi-dimensional input data includes random multi-dimensional vector data.

P. One or more non-transitory computer-readable media storing instructions that, when executed, cause one or more processors to perform operations comprising: receiving, at a generator component, multi-dimensional input data and map data associated with an environment; generating, using the generator component and based at least in part on the multi-dimensional input data, a generated top-down scene; inputting, to a discriminator component, scene data comprising the generated top-down scene and a real top-down scene; receiving, from the discriminator component, binary classification data indicative of whether an individual scene in the scene data is classified as generated or classified as captured; and providing the binary classification data as a loss to the generator component and the discriminator component.

Q. The one or more non-transitory computer-readable media of paragraph P, wherein: the generated top-down scene includes object position data associated with an object and velocity data associated with the object.

R. The one or more non-transitory computer-readable media of paragraph P or Q, wherein the operations further comprise: generating a simulation scenario based on the generated top-down scene; and determining a response of a simulated vehicle controller based at least in part on executing the simulation scenario.

S. The one or more non-transitory computer-readable media of any of paragraphs P-R, wherein the operations further comprise: providing autonomous vehicle data to the generator component to generate the generated top-down scene.

T. The one or more non-transitory computer-readable media of paragraph S, wherein the operations further comprise: conditioning the scene data based on a state of an autonomous vehicle.

U. A system comprising: one or more processors; and one or more non-transitory computer-readable media storing instructions executable by the one or more processors, wherein the instructions, when executed, cause the system to perform operations comprising: receiving scene data associated with an environment proximate a vehicle; inputting the scene data to a convolutional neural network (CNN) discriminator trained using a generator and a classification of an output of the CNN discriminator; receiving, from the CNN discriminator, an indication of whether the scene data is a generated scene or a captured scene; responsive to an indication that the scene data is a generated scene: generating a caution notification indicating that a current environmental situation is different from any previous situations; and communicating the caution notification to at least one of a vehicle system or a remote vehicle monitoring system.

V. The system of paragraph U, wherein: during training of the CNN discriminator, binary classification data associated with the scene data is provided as a loss to the CNN discriminator.

W. The system of paragraph U or V, wherein: the scene data includes multiple channels of top-down image data.

X. The system of paragraph W, wherein: the multiple channels of top-down image data include an object, position data associated with the object, and velocity data associated with the object.

Y. The system of any of paragraphs U-X, the operations further comprising: determining a vehicle action based on the caution notification, wherein the action includes at least one of controlling the vehicle, updating map data, or identifying an object proximate the vehicle.

Z. A method comprising: receiving scene data associated with an environment proximate a vehicle; inputting the scene data to a convolutional neural network (CNN) discriminator trained using a generator and a classification of an output of the CNN discriminator; receiving, from the CNN discriminator, an indication of whether the scene data is a generated scene or a captured scene; responsive to an indication that the scene data is a generated scene: generating a caution notification indicating that a current environmental situation is different from any previous situations; and communicating the caution notification to at least one of a vehicle system or a remote vehicle monitoring system.

AA. The method of paragraph Z, wherein: the scene data includes multiple channels of top-down image data.

AB. The method of paragraph AA, wherein: the multiple channels of top-down image data include an object, position data associated with the object, and velocity data associated with the object.

AC. The method of any of paragraphs Z-AB, further comprising: determining a vehicle action based on the caution notification.

AD. The method of paragraph AC, wherein: the vehicle action includes at least one of modifying a vehicle trajectory, slowing the vehicle, or stopping the vehicle.

AE. The method of paragraph AC or AD, wherein: the vehicle action includes at least one of logging data associated with a vehicle status, logging data associated with the environment proximate a vehicle, or logging the scene data.

AF. The method of any of paragraphs Z-AE, further comprising: determining a risk associated with the scene data; and determining at least one safety surrogate metric associated with the scene data.

AG. The method of paragraph AF, wherein: the safety surrogate metric is used to train the CNN discriminator.

AH. The method of any of paragraphs Z-AG, further comprising: receiving sensor data from a sensor associated with the vehicle; and determining the scene data based at least in part on the sensor data.

AI. The method of any of paragraphs Z-AH, further comprising: transmitting a request for a command to a remote computing device based on determining that the scene data is determined by the CNN discriminator to be a generated scene.

AJ. The method of any of paragraphs Z-AI, further comprising: inputting an indication of a scene to a planning system associated with the vehicle, wherein the indication of the scene is a high caution mode.

AK. One or more non-transitory computer-readable media storing instructions that, when executed, cause one or more processors to perform operations comprising: receiving scene data associated with an environment proximate a vehicle; inputting the scene data to a convolutional neural network (CNN) discriminator trained using a generator and a classification of an output of the CNN discriminator; receiving, from the CNN discriminator, an indication of whether the scene data is a generated scene or a captured scene; responsive to an indication that the scene data is a generated scene: generating a caution notification indicating that a current environmental situation is different from any previous situations; and communicating the caution notification to at least one of a vehicle system or a remote vehicle monitoring system.

AL. The one or more non-transitory computer-readable media of paragraph AK, wherein the operations further comprise: determining a vehicle action based on the caution notification.

AM. The one or more non-transitory computer-readable media of paragraph AL, wherein: the vehicle action includes at least one of modifying a vehicle trajectory, slowing the vehicle, or stopping the vehicle.

AN. The one or more non-transitory computer-readable media of any of paragraphs AK-AM, wherein the operations further comprise: determining a risk associated with the scene data; and determining at least one safety surrogate metric associated with the scene data.

While the example clauses described above are described with respect to one particular implementation, it should be understood that, in the context of this document, the content of the example clauses can also be implemented via a method, device, system, computer-readable medium, and/or another implementation. Additionally, any of examples A-AN may be implemented alone or in combination with any other one or more of the examples A-AN.

CONCLUSION

While one or more examples of the techniques described herein have been described, various alterations, additions, permutations and equivalents thereof are included within the scope of the techniques described herein. In the description of examples, reference is made to the accompanying drawings that form a part hereof, which show by way of illustration specific examples of the claimed subject matter. It is to be understood that other examples can be used and that changes or alterations, such as structural changes, can be made. Such examples, changes or alterations are not necessarily departures from the scope with respect to the intended claimed subject matter. While the steps herein can be presented in a certain order, in some cases the ordering can be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

What is claimed is:

1. A system comprising:
   one or more processors; and
   one or more non-transitory computer-readable media storing instructions executable by the one or more processors, wherein the instructions, when executed, cause the system to perform operations comprising:
      inputting, to a first convolutional neural network (CNN), multi-channel image data and map data of an environment;
      generating, using the first CNN and based at least in part on the multi-channel image data and the map data, a generated top-down scene including first occupancy information and first attribute information for generated objects within the generated top-down scene, wherein the generated objects are absent in the multi-channel image data and the map data;
      inputting, to a second CNN, scene data comprising the generated top-down scene and a real top-down scene including second occupancy information and second attribute information for one or more real objects within the real top-down scene;
      receiving, from the second CNN, binary classification data indicative of whether an individual scene in the scene data is classified as generated or not generated; and
      providing the binary classification data as a loss to the first CNN and the second CNN.

2. The system of claim 1, wherein:
   the first attribute information for the generated objects within the generated top-down scene includes at least one of object position data, object velocity data, or object state data.

3. The system of claim 1, the operations further comprising:
   generating a simulation scenario based on the generated top-down scene; and determining a response of a simulated vehicle controller based at least in part on executing the simulation scenario.

4. The system of claim 1, wherein:
the multi-channel image data comprising a first channel representing first information and a second channel representing second information different from the first information.

5. The system of claim 1, the operations further comprising:
providing a safety surrogate metric to the first CNN to condition the generated top-down scene.

6. The system of claim 5, wherein:
the safety surrogate metric identifies a safety risk associated with the multi-channel image data or the map data.

7. A method, comprising:
inputting, to a generator component, multi-channel image data and map data;
generating, using the generator component and based at least in part on the multi-channel image data and the map data, a generated top-down scene comprising a generated object absent from the multi-channel image data, the generated top-down scene including attribute information for the generated object;
inputting, to a discriminator component, scene data comprising the generated top-down scene including the generated object and a real top-down scene including a real object;
receiving, from the discriminator component, binary classification data indicative of whether an individual scene in the scene data is classified as one of: generated or not generated; and
providing the binary classification data as a loss to the generator component and the discriminator component.

8. The method of claim 7, wherein:
the attribute information includes object position data associated with the generated object and velocity data associated with the generated object.

9. The method of claim 7, further comprising:
generating a simulation scenario based on the generated top-down scene; and
determining a response of a simulated vehicle controller based at least in part on executing the simulation scenario.

10. The method of claim 7, wherein:
the generated top-down scene including the generated object is based at least in part on information related to a real-world object.

11. The method of claim 7, further comprising:
providing autonomous vehicle data to the generator component to generate the generated top-down scene.

12. The method of claim 11, further comprising:
conditioning the generated top-down scene based on a state of an autonomous vehicle.

13. The method of claim 7, wherein:
the generator component includes a first convolutional neural network (CNN) and the discriminator component includes a second CNN.

14. The method of claim 7, further comprising:
inputting map data to the generator component, wherein the map data includes information related to objects and roadways in an environment.

15. The method of claim 7, wherein:
the generator component further receives vector data as input.

16. One or more non-transitory computer-readable media storing instructions that, when executed, cause one or more processors to perform operations comprising:
inputting, to a generator component, multi-channel image data and map data associated with a real-world environment;
generating, using the generator component and based at least in part on the multi-channel image data and the map data, a generated top-down scene comprising a generated object absent from the multi-channel image data and the map data, the generated top-down scene including attribute information for the generated object;
inputting, to a discriminator component, scene data comprising the generated top-down scene including the generated object and a real top-down scene including a real object;
receiving, from the discriminator component, binary classification data indicative of whether an individual scene in the scene data is classified one of: generated or not generated; and
providing the binary classification data as a loss to the generator component and the discriminator component.

17. The one or more non-transitory computer-readable media of claim 16, wherein:
the attribute information includes object position data associated with the generated object and velocity data associated with the generated object.

18. The one or more non-transitory computer-readable media of claim 16, wherein the operations further comprise:
generating a simulation scenario based on the generated top-down scene; and
determining a response of a simulated vehicle controller based at least in part on executing the simulation scenario.

19. The one or more non-transitory computer-readable media of claim 16, wherein the operations further comprise:
receiving autonomous vehicle data describing one or more of: a position, a direction of movement, a speed, or historic information associated with an autonomous vehicle operating in the real-world environment;
inputting the autonomous vehicle data to the generator component, wherein the generated top-down scene is further based at least in part on the autonomous vehicle data.

20. The one or more non-transitory computer-readable media of claim 16, wherein the operations further comprise:
conditioning the scene data based on a state of an autonomous vehicle.

* * * * *